United States Patent [19]

Caron et al.

[11] 4,066,054

[45] Jan. 3, 1978

[54] TRANSDUCER CIRCUITS

[75] Inventors: LaVerne Andrew Caron; Lawrence William Tomczak, both of Sterling Heights; Frederick William Crall, Farmington, all of Mich.

[73] Assignee: Chrysler Corporation, Highland Park, Mich.

[21] Appl. No.: 642,924

[22] Filed: Dec. 22, 1975

Related U.S. Application Data

[62] Division of Ser. No. 559,203, March 17, 1975, Pat. No. 3,997,801.

[51] Int. Cl.² .......................... F02P 5/04; F02B 3/00
[52] U.S. Cl. ........................ 123/117 R; 123/32 ED; 123/32 EJ; 331/65
[58] Field of Search ........ 123/32 CA, 117 R, 32 ED, 123/139 E, 32 EJ; 331/65; 307/308

[56] References Cited

U.S. PATENT DOCUMENTS

| | | | |
|---|---|---|---|
| 3,474,332 | 10/1969 | Brown | 331/65 |
| 3,483,851 | 12/1969 | Reichardt | 123/32 CA |
| 3,832,981 | 9/1974 | Wakamatsu | 123/32 CA |
| 3,935,851 | 2/1976 | Wright et al. | 123/32 CA |
| 3,973,539 | 8/1976 | Jones et al. | 123/32 CA |
| 3,981,287 | 9/1976 | Williams et al. | 123/32 CA |
| 3,997,801 | 12/1976 | Caron et al. | 331/65 |

Primary Examiner—Ronald B. Cox

Attorney, Agent, or Firm—Baldwin & Newtson

[57] ABSTRACT

An electronic engine spark timing controller contains a throttle position transducer circuit and an intake manifold vacuum transducer circuit which provide respective signals representing the throttle position and the magnitude of intake manifold vacuum. Each of these two circuits contains a novel configuration of electronic circuit elements to develop an output electrical waveform composed of repetitive pulses each of which has a pulse width representative of the corresponding mechanical input signal which is supplied to the circuit via a transducer in the form of a coil whose inductance is varied in accordance with the mechanical input signal. The coil in each transducer circuit forms a portion of an RL type monostable circuit which exhibits an electrical transient when triggered. Both transducer circuits are triggered from a free-running pulse generator which is set to generate pulses at a fixed frequency. The pulse width of the trigger pulses used to trigger the transducer circuits is appreciably less than the pulse width of the output pulses of the transducer circuits, and each transducer circuit contains a feedback circuit which, when the monostable has been triggered by a pulse from the pulse generator, enables the electrical transient generated therein to continue. The output signals are used in conjunction with additional circuitry to provide spark timing control for the engine.

8 Claims, 1 Drawing Figure

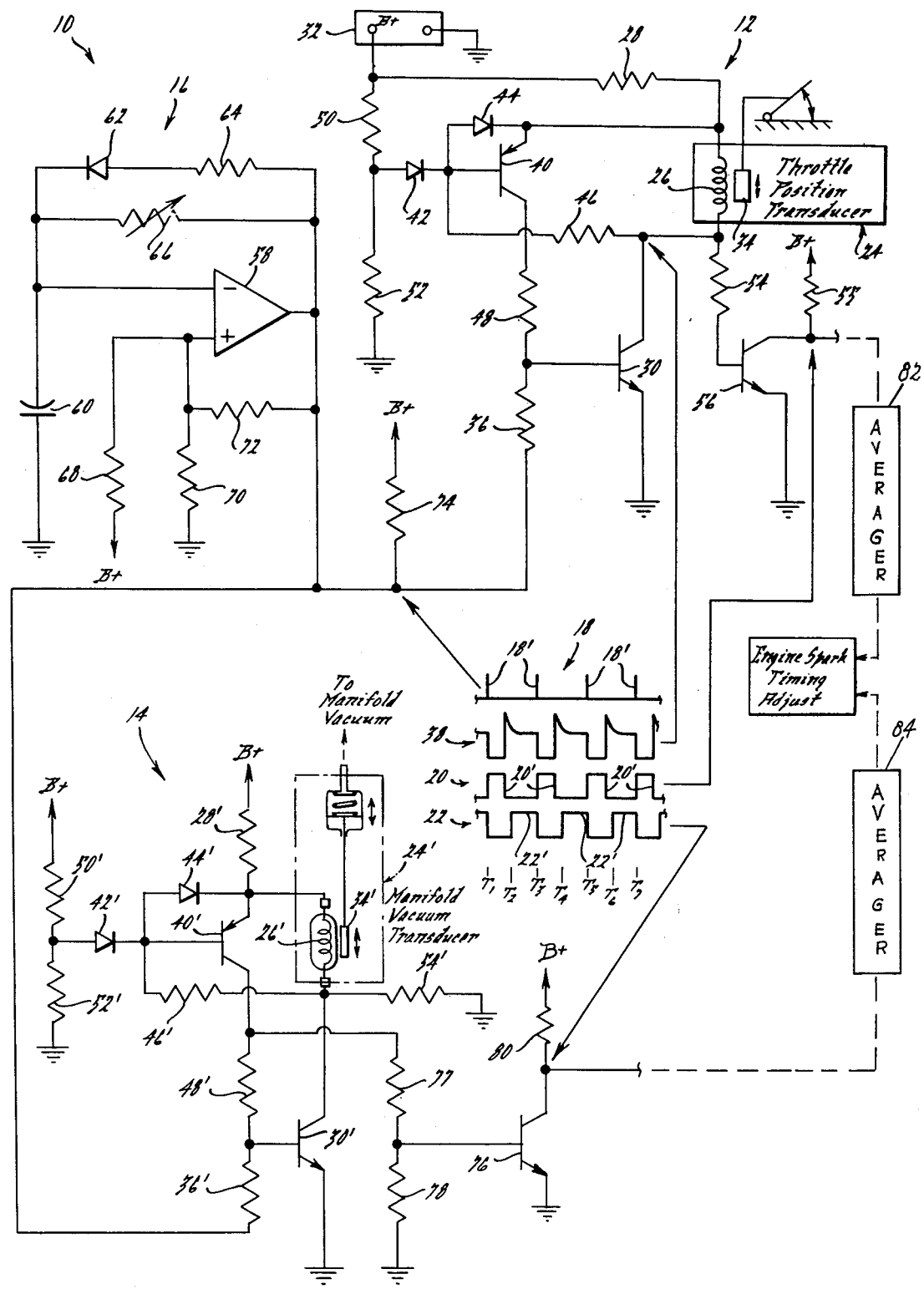

TRANSDUCER CIRCUITS

This is a division of application Ser. No. 559,203 filed Mar. 17, 1975 now U.S. Pat. No. 3,997,801.

BACKGROUND AND SUMMARY OF THE INVENTION

The present invention pertains to transducer circuits and specifically to novel transducer circuits which provide a series of output pulses whose pulse widths vary in accordance with mechanical input signals supplied to the circuits. The invention is especially well suited for use in electronic engine control circuits such as an electronic engine spark timing controller.

Various types of pulse width transducer circuits have heretofore been used in engine control applications. Examples of such circuits are shown in the following U.S. Pat. Nos. 3,483,851, 3,490,424, 3,566,847, 3,616,784, 3,670,706, 3,774,580, 3,755,767, and 3,778,729.

The present invention is directed toward new and improved transducer circuits which: exhibit improved linearity in the relationship of a mechanical input signal to an electrical output signal; are less sensitive to temperature changes; and provide rapid response to changes in the input signal. The foregoing features and advantages, along with additional ones, will be seen in the ensuing description and claims which are to be taken in conjunction with the accompanying drawing.

BRIEF DESCRIPTION OF THE DRAWING

The drawing illustrates a preferred embodiment of electronic circuitry incorporating principles of the present invention according to the best mode presently contemplated in carrying out the invention. The single drawing FIGURE illustrates an electronic schematic diagram of transducer circuits embodying principles of the present invention as applied to an electronic engine spark timing controller for use in an internal combustion engine.

DESCRIPTION OF THE PREFERRED EMBODIMENT

A transducer circuit 10 embodying the inventive principles disclosed herein is shown in use in an electronic engine spark timing controller for converting an intake manifold vacuum signal and a throttle position signal into corresponding electrical output signals. These electrical output signals, each of which is a series of pulses whose pulse width is modulated in accordance with the corresponding mechanical input, are supplied to additional circuitry which adjusts the engine spark timing in accordance with the signals to provide both improved engine operation and also reduced emissions from the engine.

The transducer circuit 10 contains a throttle position transducer circuit 12, an intake manifold vacuum transducer circuit 14, and a pulse generator circuit 16 which is common to both transducer circuits 12 and 14. Briefly, pulse generator 16 provides an output waveform 18 composed of individual positive-going trigger pulses 18' which occur at predetermined uniform time intervals such as shown by times T1, T3, T5, T7, etc. in the drawing. In response, circuit 12 develops an output waveform 20 composed of repetitive positive-going pulses 20' which commence at times T1, T3, T5, T7, etc. Each of the pulses has a pulse width which, as will be explained hereinafter, depends upon the mechanical input signal provided by the throttle position. Likewise, circuit 14 develops an output waveform 22 composed of individual positive-going pulses 22' which commence at times T2, T4, T6, etc. The pulses 22' have a width which is a function of the magnitude of intake manifold vacuum.

Considering throttle position transducer circuit 12 in greater detail, it will be seen that a throttle position transducer 24 comprises an inductive coil 26 electrically connected as illustrated in circuit with a resistor 28 and a main transistor 30 across a D.C. power supply 32. The inductance of coil 26 and the resistance of resistor 28 define an RL time constant, and the circuit is repetitively caused to undergo an electrical exponential RL transient by controlled switching of transistor 30. Throttle position transducer 24 further comprises a ferrite core 34 disposed within coil 26 and operatively coupled by means of appropriate linkage with the throttle of the engine. By selectively positioning core 34 relative to coil 26, the inductance of coil 26 is made to change with changes in the throttle position, and in the present system the inductance is caused to decrease as the throttle is increasingly opened. Therefore, the value of the time constant defined by coil 26 and resistor 28 will be in inverse proportion to the amount of throttle opening.

Circuit 12 further comprises a resistor 36 through which the pulses 18' from pulse generator 16 are supplied across the base-emitter circuit of transistor 30. In this way transistor 30 is switched from a condition of non-conduction into a condition of full conduction during each pulse 18'. Because resistor 28 and coil 26 are connected in series from the positive terminal of supply 32 to the collector of transistor 30, the switching of transistor 30 from a condition of non-conduction to a condition of full conduction will subject the circuit to a transient condition. When this switching of transistor 30 occurs, essentially the full power supply voltage will be impressed across coil 26 with the terminal thereof which is common to the collector of transistor 30 experiencing a sudden voltage drop. The waveform 38 illustrates the voltage at the collector of transistor 30.

One feature of the present invention resides in the feedback circuit which is operatively coupled in circuit to detect the initiation of the transient and to maintain transistor 30 in full conduction after the pulse 18' which initiated the transient has terminated. This feedback circuit includes a PNP transistor 40, a pair of diodes 42 and 44, and a plurality of four resistors 46, 48, 50 and 52. The emitter of transistor 40 is connected to the junction of coil 26 and resistor 28 while the collector of transistor 40 connects through resistor 48 to the base of transistor 30. The base of transistor 40 is connected through resistor 46 to the junction of coil 26 and the collector of transistor 30. By so connecting the base-emitter circuit of transistor 40 across coil 26, transistor 40 is switched from a condition of non-conduction into a condition of full conduction in response to the initial transient voltage appearing across coil 26, as caused by the switching of transistor 30 into conduction. With transistor 40 in a condition of full conduction, current is drawn from supply 32, through resistor 28, through the emitter-collector of transistor 40, through resistor 48 to the base of transistor 30 to thereby provide adequate base current for this latter transistor to maintain the same in conduction after the pulse 18' terminates. Since transistor 30 is thus maintained in full conduction, the transient continues as an increasing current flow from supply 32 through resistor 28, through coil 26, and the collector-emitter circuit of transistor 30 the current magnitude increasing along a negative exponential curve toward a final steady-state magnitude. The connection of resistors 50 and 52 as a voltage divider across power supply 32 defines at the junction of the two resistors a reference level which is supplied through diode 42 to the base of transistor 40. The arrangement provided by resistor 50 and 52 and diode 42 defines a voltage clamp which clamps the voltage at the base of transistor 40 to a minimum potential should this voltage otherwise tend to be driven less than this minimum. By making resistors 50 and 52 of equal resistance, the voltage at which the circuit is clamped is essentially one-half the supply voltage. When transistor 30 is switched into conduction, the voltage clamp establishes a reference potential against which the transient is compared and is used to terminate the transient when the transient passes through this reference potential. This is accomplished as follows.

When transistor 30 is switched into conduction, the potential at the junction of resistor 46 and coil 26 is forced almost to ground and is maintained at this potential so long as transistor 30 remains in conduction. The voltage at the junction of coil 26 and resistor 28 will decrease along a negative exponential curve heading toward the potential at the collector of transistor 30. However, as the potential at the junction of coil 26 and resistor 28 passes through the reference potential established at the base of transistor 40 by the voltage clamp, this latter transistor will suddenly switch from full conduction to non-conduction. Because the circuit parameters are selected such that the width of each pulse 18' is long enough to permit the feedback circuit to gain control of transistor 30 but short enough that it is terminated before transistor 40 is switched back to non-conduction, the switching of transistor 40 into non-conduction thereby terminates the base current flow into transistor 30 and suddenly switches this latter transistor from full conduction into non-conduction. With transistor 30 now non-conducting, the RL transient is terminated and the energy in coil 26 is dissipated through resistor 46 and diode 44. Diode 44 not only provides a discharge path for coil 26, but also provides reverse voltage protection for the base-emitter junction of transistor 40. Because the reference potential applied to the base of transistor 40 by the clamp is constant, the transient at the junction of resistor 28 and coil 26 must pass through this potential before conduction of transistor 30 can be terminated. Since the inductance of coil 26 is a function of the throttle position, the time at which this happens will vary in accordance with the throttle position, specifically the time becoming shorter as the throttle is increasingly opened. Hence, the duration for which transistor 30 is conductive is a function of the throttle position and provides a throttle position signal. The conductivity of transistor 30 is monitored by an output circuit containing a pair of resistors 54, 55 and a transistor 56 connected as illustrated so that the waveform 20 is developed at the collector of transistor 56. The width of each pulse 20' is in inverse proportion to the amount of throttle opening.

Pulse generator 16 comprises a comparator 58, a capacitor 60, a diode 62 and a plurality of resistors 64, 66, 68, 70, 72 and 74 connected as illustrated. Comparator 58 is an electronic device which compares the signals at its inverting and non-inverting input terminals and provides an output signal which is essentially a low impedance to ground when the signal at the non-inverting input terminal exceeds the signal at the inverting input terminal, and which is essentially a high impedance to ground when the signal at the inverting input terminal exceeds the signal at the non-inverting input terminal. Resistors 68 and 70 connect across the power supply to provide to the non-inverting input terminal of comparator 58 a reference signal. Resistor 72 is connected to provide hysteresis in the switching characteristic by modifying the reference signal to the non-inverting input in accordance with the output signal of comparator 58. The magnitude of the signal developed across capacitor 60 is supplied to the inverting input terminal of comparator 58 for comparison with the signal supplied to the non-inverting input. Assuming that capacitor 60 is uncharged, then the magnitude of the signal at the non-inverting input exceeds the magnitude of the signal across capacitor 60 so that the output of comparator 58 is a high impedance to ground. Capacitor 60 is now charged from the positive supply through resistor 74 and the parallel combination of resistors 64 and 66, diode 62 being poled to permit current to flow through resistor 64 under this condition. When capacitor 60 has been charged to a level which exceeds the signal at the non-inverting input then the comparator output becomes a low impedance to ground. Capacitor 60 now discharges through resistor 66 alone since diode 62 is reverse biased and permits no conduction through resistor 64. When capacitor 60 has discharged an amount sufficient to drop the potential at the inverting input terminal below the signal at the non-inverting input terminal then the output of comparator 58 again switches to a high impedance to ground so that the capacitor now charges. In this way pulse generator 16 develops the waveform 18 as taken at the output of comparator 58. Preferably resistor 66 is adjustable to permit the discharge rate of capacitor 60 be set to a desired rate, but is sufficiently large relative to resistor 64 so that resistor 64 primarily determines the width of the pulses 18'. (It will also be appreciated that the initial charging of the capacitor 60 will be longer than usual since it is assumed that the capacitor is initially unchanged.)

Circuit 14 is virtually identical to circuit 12 and, therefore, like components in the two circuits are identified by the same base numeral with those components in circuit 14 further being primed. Circuit 14 differs from circuit 12 in only several respects. First, resistor 54' is connected from the junction of coil 26' and the collector of transistor 30' directly to ground; whereas the resistor 54 in circuit 12 was connected to the base of transistor 56. Secondly, the output signal is developed at the collector of an NPN transistor 76 whose base is connected to the junction of a pair of series connected resistors 77 and 78 which connect from the collector of transistor 40' to ground. The emitter of transistor 76 connects to ground, and the collector, through a resistor 80 to the positive terminal of supply 32. With this arrangement, transistor 76 conducts essentially concurrently with transistors 30' and 40' so that the pulse width of each pulse 22' is equal to the period of pulse train 18 minus the time that transistors 30' and 40' are conducting. By constructing transducer 24' such that the inductance of coil 26' decreases as the magnitude of vacuum increases, the width of each pulse 22' increases as the magnitude of vacuum increases.

From the foregoing description, the reader will observe that each positive-going pulse 20' begins with a trigger pulse 18' and that each positive-going pulse 22' always ends with a trigger pulse 18'. As should be apparent, change in the frequency of pulse generator 16 can particularly affect the accuracy of the width of pulse 22'. Moreover, where each waveform 20 and 22 is averaged by subsequent circuitry, for example, by averages 82 and 84 respectively, change in frequency of pulse generator 16 can affect accuracy in the average of each waveform. Hence, frequency stability of pulse generator 16 is definitely desirable. It has been found that the illustrated pulse generator 16 provides the requisite accuracy and performance in the spark ignition system which is typically subjected to a wide range of environmental conditions. Moreover, economy is attained because a common pulse generator is used to trigger both transducer circuits. An example of a suitable circuit for averaging a rectangular waveform is shown in U.S. Pat. No. 3,910,243.

A further advantage of the invention arises by the provision of the feedback circuit in each transducer circuit, in conjunction with making the widths of the trigger pulses 18' appreciably less than the widths of the pulses 20', 22'. With this feature, it is the feedback circuit alone which terminates conduction of the corresponding main transistor without any influence from a triggering pulse 18'. By selecting a high gain device for the feedback transistor, sharp cut off of the main transistor is attained. Hence, the several aspects of the invention contribute to a system characterized by improved operation resulting in improved engine operation and performance. Also the provision of diode 42 provides automatic temperature compensation since changes in the base-emitter characteristic of transistor 40 due to temperature change will be compensated for by similar change in the anode-cathode characteristics of diode 42, both PN junctions having similar junction characteristics.

By way of illustration, each transducer circuit may be designed to provide approximately 80% maximum duty cycle, and pulse waveform 18, a frequency of 4 kilohertz. An examplary design which exhibits such performance is as follows.

| Resistors 28, 28' | 1 Kilohm |
|---|---|
| Resistors 36, 36' | 10 Kilohms |
| Resistors 46, 46' | 10 Kilohms |
| Resistors 48, 48' | 2.2 Kilohms |
| Resistors 50, 50' | 2 Kilohms |
| Resistors 52, 52' | 2 Kilohms |
| Resistors 54, 54' | 12 Kilohms |
| Resistor 64 | 4.7 Kilohms |
| Resistor 68 | 220 Kilohms |
| Resistor 70 | 220 Kilohms |
| Resistor 72 | 220 Kilohms |
| Transistors 30, 30' | D33D29-30 (G.E.) |
| Transistors 40, 40' | 2N5366 |
| Diodes 42, 42', 44, 44' | 1N4002 |
| Supply 32 | 10VDC |
| Coils 26, 26' | 3,000 turns #32 wire 40-170 millihenrys |
| Comparator 58 | ¼ LM 2901 (National) |

What is claimed is:

1. In combination:
   an internal combustion engine whose operation is controlled in accordance with a pair of mechanical input signals, each of which is representative of a corresponding engine operating parameter;
   an oscillator circuit comprising means for generating trigger pulses at a substantially constant triggering frequency which is independent of engine speed;
   a first monostable circuit which is operatively coupled with said oscillator circuit to receive each said trigger pulse and is immediately tripped upon receipt thereof into its unstable state to develop a first rectangular signal waveform having a frequency exactly equal to that of said trigger pulses and an average value representative of one of said mechanical input signals;
   a second monostable circuit which is operatively coupled with said oscillator circuit to receive each said trigger pulse and is immediately tripped upon receipt thereof into its unstable state to develop a second rectangular signal waveform having a frequency exactly equal to that of said trigger pulses and an average value representative of the other of said mechanical input signals;
   first averaging circuit means coupled with said first monostable circuit for averaging said first waveform;
   second averaging circuit means coupled with said second monostable circuit for averaging said second waveform;
   and means responsive to the two averaged signals of said first and second averaging circuit means for controlling operation of the engine.

2. The combination called for in claim 1 wherein said first monostable circuit, when in its unstable condition, causes said first waveform to have a more positive voltage level than when in its stable condition and said second monostable circuit, when in its unstable condition, causes said second waveform to have a less positive voltage level than when in its stable condition.

3. The combination called for in claim 1 wherein one of said rectangular waveforms is representative of engine throttle position and the other of said rectangular waveforms is representative of engine manifold vacuum.

4. The combination of claim 1 wherein said oscillator means comprises means for repetitively generating a triggering pulse which triggers both said monostable circuits at triggering frequency on the order of 4 kilohertz.

5. The combination of claim 1 wherein said oscillator comprises a comparator, an RC feedback circuit connecting the output of said comparator with one input of said comparator, and a reference circuit means connected to the other input of said comparator.

6. In combination:
   an internal combustion engine whose operation is controlled in accordance with a pair of mechanical input signals, each of which is representative of a corresponding engine operating parameter;
   a first monostable circuit for providing a first electrical signal composed of pulses each of whose time duration is representative of one of said mechanical input signals;
   a second monostable circuit for providing a second electrical signal composed of pulses each of whose time duration is representative of the other of said mechanical input signals;
   means responsive to said electrical signals for controlling the engine operation in accordance with the durations of the pulses of said electrical signals; and an oscillator commonly connected to both said monostable circuits for causing said circuits to generate their respective output signals; and wherein said oscillator comprises a pulse generator which generates trigger pulses for triggering said monostable circuits and the duration of each pulse of said first monostable circuit is measured backwardly in time from each trigger pulse and the duration of each pulse of said second monostable circuit is measured forwardly in time from each trigger pulse.

7. The combination of claim 6 further including first averaging circuit means operatively coupled with said first monostable circuit for averaging the time durations of the pulses composing said first electrical signal and second averaging circuit means operatively coupled with said second monostable circuit for averaging the time durations of the pulses composing said second electrical signal.

8. The combination of claim 6 wherein said pulse generator generates said trigger pulses at a substantially constant triggering frequency which is independent of engine speed.

* * * * *